United States Patent
Ogawa et al.

(10) Patent No.: US 9,601,401 B2
(45) Date of Patent: Mar. 21, 2017

(54) SOLVENTLESS ONE LIQUID TYPE CYANATE ESTER-EPOXY COMPOSITE RESIN COMPOSITION

(75) Inventors: Ryo Ogawa, Kuki (JP); Shinsuke Yamada, Kuki (JP)

(73) Assignee: Adeka Corporation, Tokyo (JP)

( * ) Notice: Subject to any disclaimer, the term of this patent is extended or adjusted under 35 U.S.C. 154(b) by 110 days.

(21) Appl. No.: 13/497,811

(22) PCT Filed: Jul. 23, 2010

(86) PCT No.: PCT/JP2010/004721
§ 371 (c)(1),
(2), (4) Date: Mar. 23, 2012

(87) PCT Pub. No.: WO2011/036836
PCT Pub. Date: Mar. 31, 2011

(65) Prior Publication Data
US 2012/0178853 A1    Jul. 12, 2012

(30) Foreign Application Priority Data
Sep. 25, 2009   (JP) .................... 2009-219980

(51) Int. Cl.
| C08L 63/00 | (2006.01) |
| C09J 163/00 | (2006.01) |
| C08G 59/02 | (2006.01) |
| C08G 59/56 | (2006.01) |
| C08G 59/62 | (2006.01) |
| C08G 59/50 | (2006.01) |
| C09J 11/04 | (2006.01) |
| C09J 11/06 | (2006.01) |
| C09J 11/08 | (2006.01) |
| H01L 23/29 | (2006.01) |
| H01L 23/31 | (2006.01) |
| C08K 5/00 | (2006.01) |
| C08K 5/13 | (2006.01) |
| C08K 5/31 | (2006.01) |
| C08K 5/315 | (2006.01) |
| C08K 3/22 | (2006.01) |
| C08K 3/36 | (2006.01) |

(Continued)

(52) U.S. Cl.
CPC .......... *H01L 23/295* (2013.01); *C08G 59/686* (2013.01); *C08G 73/0655* (2013.01); *C08K 3/0033* (2013.01); *C08K 3/22* (2013.01); *C08K 3/36* (2013.01); *C08L 63/00* (2013.01); *H01L 23/293* (2013.01); *C08L 79/04* (2013.01); *H01L 2924/0002* (2013.01)

(58) Field of Classification Search
CPC .......... C08L 63/00–63/10; C08L 79/04; C08L 2666/20; C09D 163/00–163/10; C09D 179/04; C09J 163/00–163/10; C09J 179/04; H01L 23/293
See application file for complete search history.

(56) References Cited

U.S. PATENT DOCUMENTS 3,876,607 A  *  4/1975  Snell ............... C08G 59/32
                                                 428/415
2005/0228148 A1 * 10/2005 Tamura et al. ........... 525/480
(Continued)

FOREIGN PATENT DOCUMENTS
JP    53-75299 A    7/1978
JP    8-176408 A    7/1996
(Continued)

OTHER PUBLICATIONS

Machine translation of JP 10-130465.*
(Continued)

*Primary Examiner* — Kregg Brooks
(74) *Attorney, Agent, or Firm* — Millen White Zelano & Branigan, P.C.

(57) ABSTRACT

The present invention is a solventless one liquid type cyanate ester-epoxy resin composition having high thermal resistance as well as excellent storage stability and curing properties, which contains (A) cyanate ester, (B) epoxy resin, (C) guanidine compounds and (D) at least one kind of phenol compounds selected from a group consisting of phenol compounds represented by the following general formulae. In the general formulae, 1 is an integer selected from 0 to 4, $R^1$ represents an unsubstituted or fluorine-substituted monovalent hydrocarbon group.

General formula:

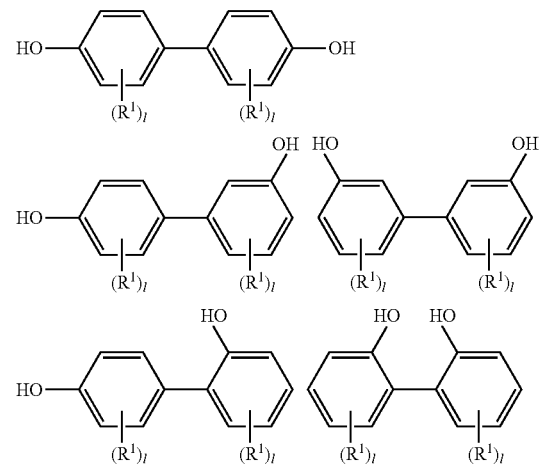

13 Claims, No Drawings

(51) Int. Cl.
  *C08G 59/68* (2006.01)
  *C08G 73/06* (2006.01)
  *C08K 3/00* (2006.01)
  C08K 7/02 (2006.01)
  C08L 79/04 (2006.01)

(56) References Cited

U.S. PATENT DOCUMENTS

| | | | |
|---|---|---|---|
| 2006/0173101 A1* | 8/2006 | Takahata et al. | 523/223 |
| 2008/0187763 A1* | 8/2008 | Kato et al. | 428/418 |
| 2008/0200636 A1* | 8/2008 | Nakanishi et al. | 528/105 |
| 2008/0251203 A1* | 10/2008 | Lutz | C08G 18/10 156/330 |
| 2009/0012203 A1* | 1/2009 | Nakanishi et al. | 522/135 |
| 2009/0110938 A1* | 4/2009 | Nishimura et al. | 428/425.8 |
| 2010/0210793 A1* | 8/2010 | Ogawa et al. | 525/423 |

FOREIGN PATENT DOCUMENTS

| | | | | |
|---|---|---|---|---|
| JP | 10130465 A | * | 5/1998 | C08L 63/00 |
| JP | 2001-172473 A | | 6/2001 | |
| JP | 2001-302767 A | | 10/2001 | |
| JP | 2002-128864 A | | 5/2002 | |
| JP | 2003096011 A | * | 4/2003 | C07C 39/15 |
| JP | 2007-204669 A | | 8/2007 | |
| WO | WO 2009001658 A1 | * | 12/2008 | |

OTHER PUBLICATIONS

Machine translation of JP 08-176408.*
Machine translation of JP 2002-128864.*
Machine translation of JP 2003-096011.*
International Search Report of PCT/JP2010/004721 (Sep. 7, 2010).

* cited by examiner

SOLVENTLESS ONE LIQUID TYPE CYANATE ESTER-EPOXY COMPOSITE RESIN COMPOSITION

FIELD OF THE INVENTION

The present invention relates to a cyanate ester-epoxy composite resin composition, particularly to a solventless one liquid type cyanate ester-epoxy composite resin composition comprised of cyanate ester, epoxy resin, a guanidine compound and a biphenyl compound, and having excellent storage stability, cold curing properties and thermal resistance.

BACKGROUND OF THE INVENTION

Generally an epoxy resin composition has excellent electric performance and adhesive strength. Therefore, it has been used in the past for various uses of electric or electronic fields.

In cases where only insufficient results can be obtained even when a conventional epoxy resin is used alone or by mixture, cyanate ester-epoxy composite resin compositions comprised of mixing epoxy resin with cyanate ester are in heavy usage as a resin composition available for sealing of semiconductors or molding wherein high thermal resistance is required.

For example, resin compositions comprised of cyanate ester, epoxy resin and dicyandiamide or the like have already been proposed (Patent document 1). However, they have disadvantages in that a high curing temperature and long curing time are required. Therefore, the resin compositions having satisfactory characteristics have not been obtained yet.

PRIOR ART DOCUMENTS

Patent Documents

Patent document 1: Japanese Unexamined Patent Publication Tokkaihei 10-130465

SUMMARY OF THE INVENTION

Problems to be Solved by the Invention

Therefore, the first object of the present invention is to provide a solventless one liquid type cyanate ester-epoxy resin composition having high thermal resistance as well as excellent storage stability and curing properties, obtained by combining cyanate ester with epoxy resin.

The second object of the present invention is to provide a solventless one liquid type cyanate ester-epoxy resin composition having excellent storage stability, suitable for sealing semiconductors and molding.

The third object of the present invention is to a provide solventless one liquid type cyanate ester-epoxy composite resin composition suitable for an adhesive agent composition having excellent storage stability, cold curing properties and thermal resistance.

Means to Solve the Problems

As a result of extensive studies, the inventors of the present invention found that extremely good results can be obtained by using a specific phenol compound together with cyanate ester, epoxy resin and guanidine compounds, thereby achieving the present invention.

Namely, the present invention is solventless one liquid type cyanate ester-epoxy composite resin composition, characterized by containing (A) cyanate ester, (B) epoxy resin, (C) guanidine compounds and (D) at least one kind of phenol compounds selected from a group consisting of phenol compounds represented by the following general formulae; a cured material obtained by curing the said composition and a sealing material or an adhesive agent comprised of the aforementioned resin composition.

General Formulae:

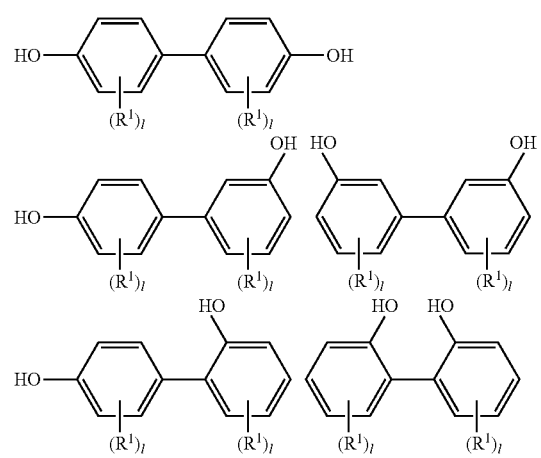

In the above general formulae, 1 is an integer selected from 0 to 4, $R^1$ represents an unsubstituted or fluorine-substituted monovalent hydrocarbon group.

In the present invention, it is preferable that the guanidine compound of the above component (C) is at least one kind of compounds selected from a group consisting of compounds represented by the following general formulae. In particular, it is preferable that it is at least one kind of compounds selected from among acetoguanamine, benzoguanamine and dicyandiamide.

General Formulae:

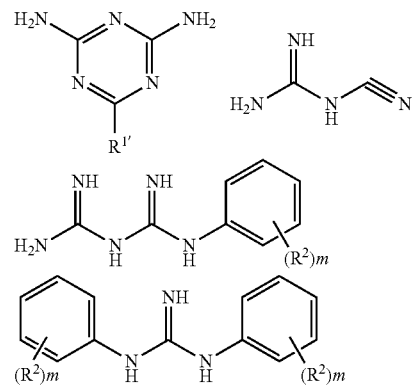

m in the above general formulae is an integer selected from 1 to 5, $R^{1'}$ is an amino group or an unsubstituted or fluorine-substituted monovalent hydrocarbon group having 1-15 carbon atoms, $R^2$ is a hydrogen atom or an alkyl group having 1-4 carbon atoms.

Furthermore, in the present invention, it is preferable that the phenol compound of the above component (D) is 4,4'-biphenol and/or 3,3',5,5'-tetramethyl-4,4' biphenol. In particular, it is preferable that the cyanate ester of the component (A) is at least one kind of compounds selected from a group consisting of the following general formulae (1) and (2), and prepolymers thereof.

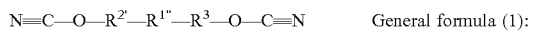
General formula (1):

$R^{1''}$ in the above general formula (1) represents an unsubstituted or fluorine-substituted divalent hydrocarbon group, —O—, —S— or a single bond. $R^{2'}$ and $R^3$ are, independently, an unsubstituted phenylene group or a phenylene group substituted by 1-4 alkyl groups respectively.

General Formula (2):

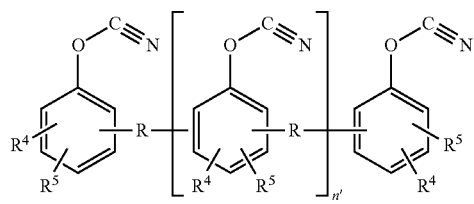

n' is a positive number selected from 1 to 100, R represents unsubstituted or fluorine-substituted divalent hydrocarbon group. $R^4$ and $R^5$ are a hydrogen atom or an alkyl group having 1-4 carbon atoms.

Effect of the Invention

The cyanate ester-epoxy resin composition of the present invention, which is excellent not only in storage stability but also in cold curing properties and thermal resistance, can be widely applied for uses such as coating compositions or adhesive agents against concrete, cement, mortar, various metals, leather, glass, rubber, plastic, wood, cloth, paper etc. In particular, it is suitably used for sealing materials to protect semiconductors, electronic materials to bond electronic parts etc. and materials for automobile.

MODES FOR CARRYING OUT THE INVENTION

Hereinafter, the cyanate ester-epoxy resin composition of the present invention will now be described in detail.

The cyanate ester of the component (A) used in the present invention is not limited in particular. However, it is preferable to use compounds represented by the following general formula (1) or (2), and prepolymers thereof wherein a part of cyanate groups in these compounds forms a triazine ring.

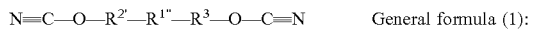
General formula (1):

$R^{1''}$ in the above general formula (1) represents an unsubstituted or fluorine-substituted divalent hydrocarbon group, —O—, —S— or a single bond. $R^{2'}$ and $R^3$ are independently an unsubstituted phenylene group or a phenylene group substituted by 1-4 alkyl groups, respectively.

General Formula (2):

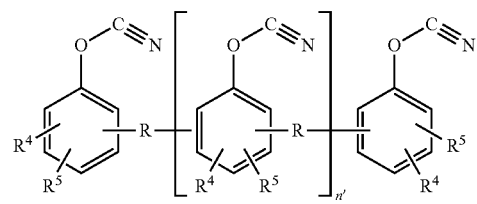

n' in the above general formula (2) represents a positive number selected from 1 to 100, R represents unsubstituted or fluorine-substituted divalent hydrocarbon group. $R^4$ and $R^5$ are a hydrogen atom or an alkyl group having 1-4 carbon atoms. Among these, in particular, the following compounds are preferable in the present invention.

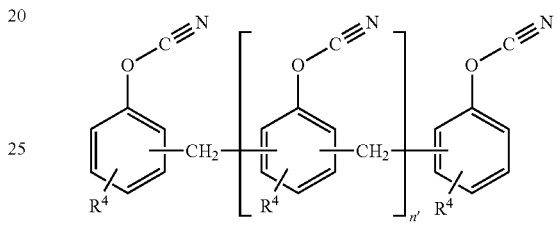

Examples of the above prepolymers are trimers of the compounds represented by the general formula (1) wherein all parts or a part of the compounds are trimerized.

In the present invention, more preferable cyanate esters are compounds represented by the following general formula (3) and prepolymers thereof. In particular, 4,4'-ethylidenebisphenylenecyanate, 2,2-bis(4-cyanatephenyl) propane and bis(4-cyanate-3,5-dimethylphenyl)methane are preferable.

General Formula (3):

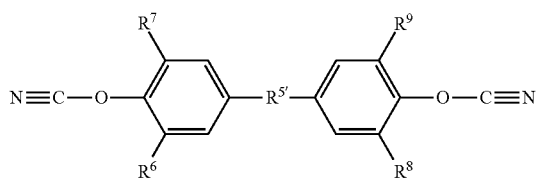

$R^{5'}$ in the above general formula (3) is selected from the following groups.

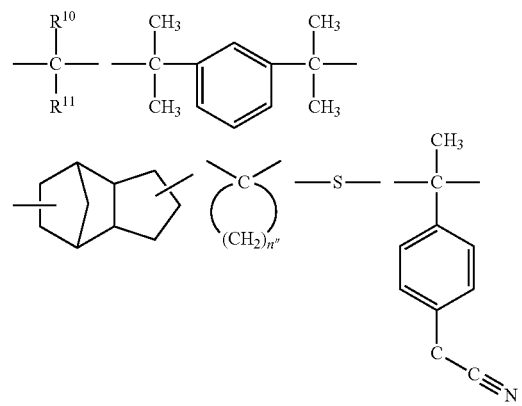

-continued

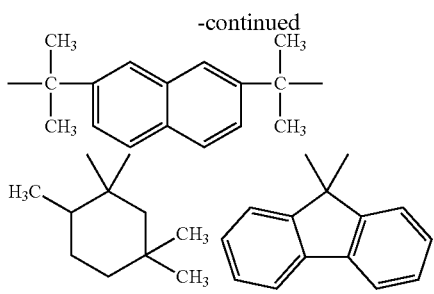

The above $R^6$-$R^{11}$ are each a hydrogen atom or an unsubstituted or fluorine-substituted methyl group, independently, and n" is an integer selected from 4 to 12.

In the present invention, these cyanate esters can be used alone or two or more kinds of them can be used in combination.

Examples of epoxy resin of the component (B) used in the present invention are polyglycidyl ether compounds of mononuclear multivalent phenol compounds such as hydroquinone, resorcin, pyrocatechol and phloroglucinol; polyglycidyl ether compounds of multinuclear multivalent phenol compounds such as dihydroxynaphthalene, bisphenol, methylenebisphenol (bisphenol F), methylene bis(ortho-cresol), ethylidene bisphenol, isopropylidene bisphenol (bisphenol A), isopropylidene bis(ortho-cresol), tetrabromobisphenol A, 1,3-bis(4-hydroxycumylbenzene), 1,4-bis(4-hydroxycumylbenzene), 1,1,3-tris(4-hydroxyphenyl)butane, 1,1,2,2-tetra(4-hydroxyphenyl)ethane, thiobisphenol, sulfobisphenol, oxybisphenol, phenol novolac, ortho-cresol novolac, ethylphenol novolac, butylphenol novolac, octylphenol novolac, resorcin novolac and terpenephenol; polyglycidyl ether compounds such as addition products of ethylene oxide with polyalcohols such as ethylene glycol, propylene glycol, butylene glycol, hexanediol, polyglycol, thiodiglycol, glycerine, trimethylol propane, pentaerythritol, sorbitol and bisphenol A; glycidyl esters of aliphatic, aromatic or alicyclic polybasic acid such as maleic acid, fumaric acid, itaconic acid, succinic acid, glutaric acid, suberic acid, adipic acid, azelaic acid, sebacic acid, dimer acid, trimer acid, phthalic acid, isophthalic acid, terephthalic acid, trimellitic acid, trimesic acid, pyromellitic acid, tetrahydrophthalic acid, hexahydrophthalic acid, endomethylene tetrahydrophthalic acid and homopolymers or copolymers of glycidyl methacrylate; epoxy compounds having glycidylamino groups such as N,N-diglycidyl aniline, bis(4-(N-methyl-N-glycidylamino) phenyl)methane, (4-oxiranylmethoxy-phenyl)bis-oxiranylmethyl-amine, (2-methyl-4-oxiranylmethoxy-phenyl)bis-oxiranylmethyl-amine and diglycidyl ortho-toluidine; epoxidized compounds of cyclic olefin compounds such as vinylcyclohexene diepoxide, dicyclopentadiene diepoxide, 3,4-epoxy cyclohexylmethyl-3,4-epoxycyclohexane carboxylate, 3,4-epoxy-6-methylcyclohexylmethyl-6-methylcyclohexane carboxylate and bis (3,4-epoxy-6-methylcyclohexylmethyl) adipate; epoxidized conjugated diene polymers such as epoxidized polybutadiene and epoxidized styrene-butadiene copolymer; and a heterocyclic compound such as triglycidylisocyanurate. These epoxy resins may be internally cross-linked by prepolymers having terminal isocyanate or may be high-molecularized by multivalent compounds having an active hydrogen (multivalent phenol, polyamine, carbonyl group-containing compound and polyphosphate ester or the like).

It is preferable that the epoxy equivalent of the above polyepoxy compounds is 70~3,000, and 90~2,000 is more preferable. Curing properties may decrease when the said epoxy equivalent is less than 70, on the other hand, sufficient physical properties of coating may not be obtained when the epoxy equivalent is more than 3,000.

Examples of the guanidine compound of the component (C) used in the present invention are compounds represented by the following general formulae.

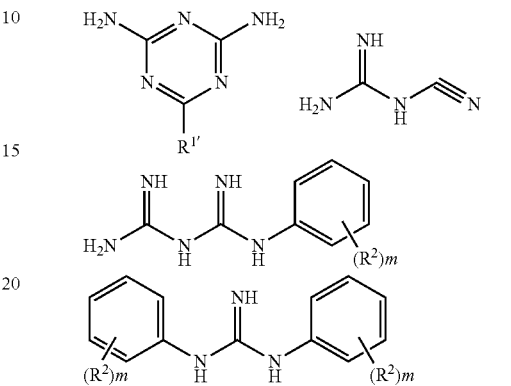

In the above general formulae, m represents an integer selected from 1 to 5, $R^{1'}$ represents an amino group, or an unsubstituted or fluorine-substituted monovalent hydrocarbon group having 1-15 carbon atoms and $R^2$ represents a hydrogen atom or an alkyl group having 1-4 carbon atoms.

In the present invention, it is preferable to use acetoguanamine, benzoguanamine or dicyandiamide, which is superior in balance between stability and reactivity, among these guanidine compounds.

Examples of the phenol compound of the component (D) used in the present invention are compounds represented by the following general formulae.

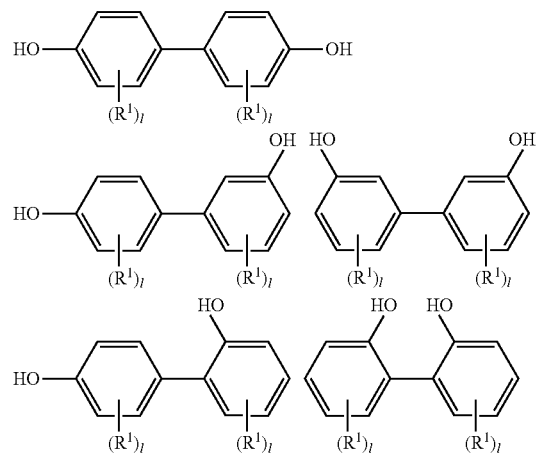

In the above general formulae, l represents an integer selected from 0 to 4, $R^1$ represents an unsubstituted or fluorine-substituted monovalent hydrocarbon group.

In the present invention, in particular, from the viewpoint of the balance between reactivity and stability, it is preferable to use 4,4'-biphenol and/or 3,3',5,5'-tetramethyl-4,4' biphenol.

As for the amount of components (A) and (B) used in the cyanate ester-epoxy resin composition of the present invention, it is preferable that the amount of component (B) is 1~10,000 mass parts relative to 100 mass parts of component (A) and 10~1,000 mass parts are more preferable, and 20~500 mass parts are optimal.

The amount of component (C) used in the cyanate ester-epoxy resin composition of the present invention is 3~60 mass parts relative to the total amount of 100 mass parts of components (A) and (B), and 5~50 mass parts are preferable.

The amount of component (D) used in the cyanate ester-epoxy resin composition of the present invention is 0.1~50 mass parts relative to the total amount of 100 mass parts of components (A) and (B), and 1~30 mass parts are preferable.

Additives as listed below can be added to the cyanate ester-epoxy resin composition of the present invention comprising of the components (A)-(D) as appropriate, within a range where the effect of the present invention is not damaged (10 mass % or less);

Surfactants such as viscosity conditioner and surface conditioner,

Flux agents used for removing oxide layers of solder;

Dyes and pigments for coloring;

Release agents such as carnauba wax used as an internal-additive;

Phenolic or sulfury antioxidants;

Hindered amines used as a radical trap agent;

Deterioration inhibitors such as ultraviolet absorber;

Cyanate ester-epoxy resin composition of the present invention can optionally be used with fillers or pigments such as glass fiber, carbon fiber, cellulose, silica sand, cement, kaolin, clay, aluminum hydroxide, bentonite, talk, silica, fine powder silica, titanium dioxide, carbon black, graphite, iron oxide, bituminous substances, metallic particle, resin particle coated with metal, resin particle like silicone rubber, and plasticizer; thickners; thixotropic agents; coupling agents; flame retardants; defoamers; fungus resistance agents; and commonly used additives such as colloidal silica and colloidal alumina, etc. In addition, sticky resins such as xylene resin and petroleum resin can be used together. The use ratio of these additives and the cyanate ester-epoxy resin composition of the present invention may be determined depending on the intended use as appropriate.

By using the cyanate ester-epoxy resin composition of the present invention in solventless one liquid type, the generation of VOC (volatile organic compound) can be prevented. Therefore, environmental-load can be lowered and materials having high security can be provided. Moreover, the cyanate ester-epoxy resin composition of the present invention has a merit that it is applicable to the fields of permeation or curing at the site of gap etc. wherein solvents cannot be used.

Solventless one liquid type cyanate ester-epoxy resin composition of the present invention can be widely used for a coating composition against concrete, cement, mortar, various metals, leather, glass, rubber, plastic, wood, cloth and paper etc., or for an adhesive agent. In particular, since one liquid type cyanate ester-epoxy resin composition of the present invention has high thermal resistance and excellent adhesive properties, it is suitably used for sealing materials to protect semiconductors, electronic materials to bond electronic parts etc. and furthermore for automobile materials.

One liquid type cyanate ester-epoxy resin composition of the present invention will now be described in more detail referring to manufacturing examples and examples, but the present invention should not be limited by these descriptions.

EXAMPLE 1

Cyanate ester resin (CE): Cyanate LeCy: Commercial name of the product manufactured by Lonza Co., Epoxy resin (EP): EP-4901E: Commercial name of the product manufactured by ADEKA CORPORATION (It is a bisphenol F type epoxy resin and its epoxy equivalent is 168.).

Benzoguanamine (BG): BG: Commercial name of the product manufactured by Nippon Carbide Industries Co., Inc.

Dicyandiamide (DICY): EH-3636AS: Commercial name of the product manufactured by ADEKA CORPORATION 4,4'-biphenol (44BP): 4,4'-biphenol manufactured by TOKYO CHEMICAL INDUSTRY CO., LTD Bis(4-hydroxyphenyl) sulfone (BPS): bis(4-hydroxyphenyl) sulfone manufactured by TOKYO CHEMICAL INDUSTRY CO., LTD The above compounds were blended as shown in the following [Table 1] and the following tests were carried out to evaluate the storage stability, curing properties and glass transition point. The results are shown in [Table 1].

(Viscosity)

Viscosity per 5 rpm at 25° C. was measured by using Brookfield E type rotation viscometer.

(Gel Time)

0.5 g of each composition obtained was dropped on a hot plate where each measured temperature was maintained, and the each composition was mixed with a spatula until the fluidity of the composition disappeared. The time until the fluidity of the composition disappeared was measured.

(Glass Transition Point))

DSC chart was obtained by carrying out a measurement using the differential scanning calorimeter (commercial name: DSC 6220) manufactured by SII Nano Technologies Inc., under the condition of 10° C./minute of temperature rising speed and 25-300° C. of scanning temperature range. In addition, under the same condition, the secondary heating was carried out to determine the glass transition point from the inflection point of the capacity curve obtained (Adhesive Properties)

In reference to JIS K 6850, shear adhesive strength of steel plate/steel plate after curing under the condition of 120° C.×1 h was measured.

TABLE 1

|  | Examples | | Comparative Examples | | | | |
| --- | --- | --- | --- | --- | --- | --- | --- |
|  | 1-1 | 1-2 | 1-1 | 1-2 | 1-3 | 1-4 | 1-5 |
| Combination |  |  |  |  |  |  |  |
| CE | 50 | 50 | 50 | 50 | 50 | 50 | 50 |
| EP | 50 | 50 | 50 | 50 | 50 | 50 | 50 |
| DICY | 7 |  | 10 |  |  | 7 |  |
| BG |  | 15 |  | 20 |  |  | 15 |
| 44BP | 3 | 10 |  |  | 15 |  |  |
| BPS |  |  |  |  |  | 3 | 10 |

TABLE 1-continued

| | Examples | | Comparative Examples | | | | |
|---|---|---|---|---|---|---|---|
| | 1-1 | 1-2 | 1-1 | 1-2 | 1-3 | 1-4 | 1-5 |
| Evaluation results Viscosity | | | | | | | |
| Initial viscosity (mPa·s) | 352 | 461 | 366 | 304 | 275 | 412 | 511 |
| Viscosity increase rate (%) | | | | | | | |
| After 25° C. × 24 h | 93 | 116 | 93 | 141 | 169 | 185 | 225 |
| Gel time | | | | | | | |
| 100° C. | 140 min | 60 min | >180 min | 90 min | 160 min | 120 min | 45 min |
| 150° C. | 13 min | 4 min 31 sec | 23 min | 6 min 55 sec | 12 min | 11 min | 3 min 55 sec |
| 180° C. | 1 min 43 sec | 1 min 12 sec | 2 min 24 sec | 1 min 12 sec | 1 min 30 sec | 1 min 51 sec | 1 min 3 sec |
| Glass transition point | | | | | | | |
| Tg(° C.) | 122.4 | 105.5 | 122.7 | 108.8 | 103.5 | 123.1 | 108.2 |

As is clear from the above Table 1, it was confirmed that when dicyandiamide, benzoguanidine and biphenyl compounds alone are used respectively (Comparative examples 1-1, 1-2 and 1-3), in particular curing properties at low temperature are poorer than when the cyanate ester-epoxy composite resin is used. In addition, it was confirmed that when a guanidine compound is combined with a phenol compound other than the phenol compound specified in the present invention (Comparative examples 1-4 and 1-5), the initial viscosity is remarkably higher and also the stability is markedly poorer than when cyanate ester-epoxy composite resin is used.

On the contrary, in cases of Examples 1-1 and 1-2 of the present invention, it was verified that the stability is more superior and in particular curing properties at low temperature are much more superior than when dicyandiamide, benzoguanidine and biphenyl compounds alone are used respectively (Comparative examples 1-1, 1-2 and 1-3).

INDUSTRIAL AVAILLABILITY

Since the solventless one liquid type cyanate ester-epoxy resin composition of the present invention has excellent storage stability as well as curing properties, and can provide materials having high security by lowering environmental-load, and also has merits that it can be applicable to applications such as permeation or curing at the site of gap where solvents can not be used, the present invention is remarkably available to the industries.

What is claimed is:
1. A solventless one liquid type cyanate ester-epoxy composite resin composition, consisting of:
(A), (B), (C) and (D);
wherein (A) is cyanate ester,
wherein (B) is at least one epoxy resin selected from the group consisting of: polyglycidyl ether compounds of mononuclear multivalent phenol compounds, polyglycidyl ether compounds of multinuclear multivalent phenol compounds, polyglycidyl ether compounds of polyalcohols, glycidyl esters of aliphatic, aromatic or alicyclic polybasic acid, homopolymers or copolymers of glycidyl methacrylate, epoxy compounds having glycidylamino groups, epoxidized compounds of cyclic olefin compounds, epoxidized conjugated diene polymers and heterocyclic glycidyl compounds, wherein (C) is at least one compound selected from the group consisting of acetoguanamine, benzoguanamine and dicyandiamido,
wherein (D) is 4,4'-biphenol and/or 3,3',5,5'-tetramethyl-4,4'-biphenol and
wherein the amount of component (B) is 10-1,000 mass parts relative to 100 mass parts of component (A), the amount of component (C) is 3-60 mass parts relative to a combined 100 mass parts of component (A) and (B), and the amount of component (D) is 0.1-50 mass parts relative to a combined 100 mass parts of component (A)+(B).

2. The solventless one liquid type cyanate ester-epoxy composite resin composition described in claim 1, wherein the cyanate ester of component (A) is at least one of the compounds selected from the group consisting of the compounds of formula (1), formula (2), and prepolymers thereof;

$$N\!\!=\!\!C\!\!-\!\!O\!\!-\!\!R^{2\prime}\!\!-\!\!R^{1\prime\prime}\!\!-\!\!R^{3}\!\!-\!\!O\!\!-\!\!C\!\!=\!\!N \qquad \text{formula (1):}$$

wherein $R^{1\prime\prime}$ represents an unsubstituted or fluorine-substituted divalent hydrocarbon group, —O—, —S— or a single bond, $R^{2\prime}$ and $R^{3}$ are, independently, an unsubstituted phenylene group or a phenylene group substituted by 1-4 alkyl groups,
formula (2):

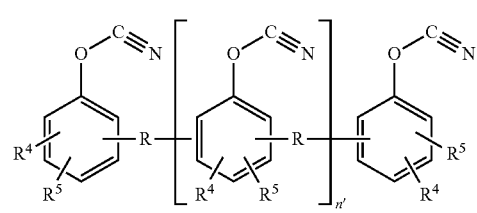

wherein n' is a positive number selected from 1 to 100, R represents an unsubstituted or fluorine-substituted divalent hydrocarbon group, and $R^{4}$ and $R^{5}$ are a hydrogen atom or an alkyl group having 1-4 carbon atoms.

3. A cured material obtained by curing the cyanate ester-epoxy composite resin composition described in claim 1 via polymerization.

4. A sealing material comprising the cyanate ester-epoxy composite resin composition described in claim 1.

5. An adhesive agent comprising the cyanate ester-epoxy composite resin composition described in claim 1.

6. A method for manufacturing a curing material comprising curing the cyanate ester-epoxy composite resin composition described in claim 1 in a mold.

7. A method for sealing a semiconductor, an electronic material or a molding, comprising sealing said semiconductor, electronic material or molding with a solventless one liquid type cyanate ester-epoxy composite resin composition described in claim 1.

8. A method for adhering together two components, comprising adhering said components with a solventless one liquid type cyanate ester-epoxy composite resin composition described in claim 1.

9. The solventless one liquid type cyanate ester-epoxy composite resin composition according to claim 1, wherein component (D) is 4,4'-biphenol.

10. The solventless one liquid type cyanate ester-epoxy composite resin composition according to claim 1, wherein component (D) is 3,3',5,5'-tetramethyl-4,4'-biphenol.

11. The solventless one liquid type cyanate ester-epoxy composite resin composition according to claim 1, wherein component (C) is acetoguanamine.

12. The solventless one liquid type cyanate ester-epoxy composite resin composition according to claim 1, wherein component (C) is benzoguanamine.

13. The solventless one liquid type cyanate ester-epoxy composite resin composition according to claim 1, wherein component (C) is dicyandiamido.

* * * * *